Aug. 5, 1958 H. A. STOVER 2,845,808

ERROR CORRECTION DEVICE

Filed Sept. 20, 1957

INVENTOR.
HARRIS A. STOVER
BY Marvin Moody
ATTORNEY 2,845,808

ERROR CORRECTION DEVICE

Harris A. Stover, Cedar Rapids, Iowa, assignor to Collins Radio Company, Cedar Rapids, Iowa, a corporation of Iowa Application September 20, 1957, Serial No. 685,114

7 Claims. (Cl. 74—394)

This invention relates in general to mechanical motion conversion and more particularly to a rotary motion converter of the type which converts a linear rotational shaft input to a rotational shaft output of any desired nonlinearity.

In the electronic art and particularly in the tuning art wherein an inductance is to be varied or a capacitance is to be varied, it ofttimes becomes necessary to incorporate means for slightly varying a rotational shaft input as, for example, a tuning shaft connected to a rotor of a condenser, from a linear rotational motion to some function other than linear to compensate for inherent variations of the tuned element which will not allow a linear-tuned frequency characteristic with a linear shaft input. For example, the plates of a tuned capacitor might be so cut that a desired change in capacitance is realized with a linear input to effect a nearly linear change in tuned frequency in a certain circuit in which the capacitance is associated; or an inductance of the permeability-tuned type may be so wound that with a linear advance of a permeable core within the windings a nearly straight-line tuning characteristic can be realized. In either of the above applications, however, there is a limit to which the physical construction of the impedance elements may be controlled to effect the desired linear result. It therefore has become necessary to employ additional means to apply a correction to the shaft rotation effecting the change in tuning whereby the inherent nonlinear characteristics of the tuning device may be compensated for by modifying the linear rotational input to obtain the desired linear-tuning characteristic.

This need is particularly realized in the linear-tuned oscillator art and systems have been devised in the art whereby a linear shaft rotation is modified to some desired degree of ninlinearity to effect a linear-tuned frequency system. Such a system is described in Patent No. 2,468,071 to Theodore A. Hunter, assignor to the assignee of the present invention. The referenced patent discloses a permeability-tuned oscillator wherein the advance of the core into the coil is modified from the normal linear advance by the provision of a plurality of washers to form a cam surface which, in cooperation with cam followers mounted on the coil form, effectively advance or retard the travel of the slug within the coil. Generally, in these previous applications, the correcting mechanism has been directly associated with the corrected element itself and as such, should the elements be sealed for purposes of temperature control and humidity, etc., the correction to be effected must necessarily be made with the seal broken and thus a change in the correction cannot readily be made.

It is an object of this invention to provide a motion-converting means of a type wherein a linear shaft rotation is converted to any desired degree of nonlinearity and thus is particularly adaptable for use with the above-discussed oscillators and which may be mounted completely outside of the oscillator per se.

It is a further object of this invention to provide a correction device employing a corrector cam which may lend itself to be automatically cut by an electronically controlled cutter since the cam is entirely independent of the circuit to be controlled and the control circuit is not disturbed in any way by the addition or removal of the cam. Still a further object of this invention is the provision for a motion-conversion device wherein a corrected output motion is realized by a single 360° cam to effect correction for any desired number of degrees of output revolutions. Still a further object of this invention is the provision of a multiturn rotational corrector wherein a single 360° correcting cam is employed.

The invention is featured in the provision of a mechanical gear system in conjunction with a 360° cam wherein the input shaft may be turned through a plurality of revolutions and the output shaft turns through the same number of revolutions but its position is constantly adjusted to slightly advance or retard from a direct following action.

These and other objects and features of the invention will become apparent from the following description when read in conjunction with the accompanying drawings, in which.

Figure 1:
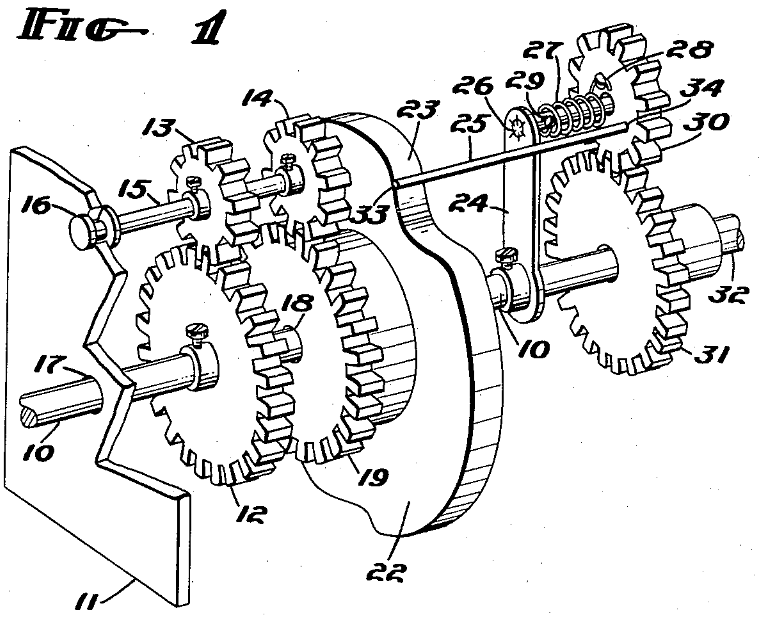
Figure 1 is a functional mechanical view of the invention.

Figure 1 illustrates the mechanical arrangement of elements embodied in the invention. A bearing plate 11 has rotatably mounted therein by means of bearing means 17, one end of an input shaft 10 to which a linear rotation motion might be imparted according to the principles of this invention. An input gear 12 is rigidly affixed to shaft 10 and rotated therewith. A cam drive gear 19 is rotatably mounted with respect to input shaft 10 by means of bearing means 18 and has rigidly affixed thereto a cam 22. It is to be understood that both cam drive gear 19 and cam 22 rotate freely with respect to input shaft 10. Cam drive gear 19 is driven from input gear 12 by means of idler gears 13 and 14 mounted on a shaft 15 which is rotatably supported by a bearing means 16 within bearing plate 11. For illustrative purposes only idler gears 13 and 14 are indicated as identical and separate gears each rigidly affixed to shaft 15. It is to be understood that idler gears 13 and 14 might be a single gear engaging both input gear 12 and cam drive gear 19.

Input shaft 10 has rigidly affixed thereto an arm member 24. A positioning gear 30 is rotatably mounted on a second shaft which has one end 26 rigidly affixed in the end of arm 24. Positioning gear 30 is spring loaded with respect to arm 24 by means of a load spring 27; one end 28 of load spring 27 being rigidly affixed to gear 30 and the other end 29 being rigidly affixed to the shaft of positioning gear 30. It is noted that positioning gear 30 engages with an output gear 31 which is rotatably mounted on the end of input shaft 10. An output shaft 32 is rigidly affixed to output gear 31 and rotated thereby.

A follower pin 25 has one end 34 rigidly affixed to positioning gear 30. The free end 33 of follower pin 25 rides on the surface 23 of cam 22 and is spring loaded against the cam surface 23 by means of aforementioned load spring 27 on the shaft of positioning gear 30.

Inherent in the operation of the device is the choice of gear ratio between input gear 12 and cam drive gear 19 through idler gears 13 and 14. This gear ratio is chosen such that as input shaft 10 and thus input gear 12 are rotated through $n$ number of turns, cam drive gear 19 is rotated through $n\pm1$ revolutions. This choice of gear ratio then, through $n$ revolutions of input shaft 10, will cause cam 22 to rotate $n\pm1$ revolutions and thus cause follower pin 25 to make one complete excursion on the surface 23 of cam 22 for *n* revolutions. More generally, should a complete excursion be desired more than once for an *n* turn input, the gear ratio would be chosen such that cam 22 makes $n\pm m$ revolutions, where *m* is the repetitive number of complete correction cycles desired. This operation becomes apparent from a consideration of the fact that input rotational motion to shaft 10 causes arm 24 to rotate directly therewith and thus through the inermesh between positioning gear 30 and output gear 31, the input rotational motion is imparted directly to output shaft 32. If cam 22 had a circular surface, that is with no change in cam radius throughout its periphery 23, the device would act as a normal translater of rotational motion. Positioning gear 30 then, in having no rotational motion with respect to arm 24 imparted thereon, would merely serve to transfer the motion of input shaft 10 to output gear 31 in a 1:1 ratio. It is noted, however, that positioning gear 30 is rotatably mounted with respect to arm 24 and its position with respect to arm 24 and thus input shaft 10 is determined by the action of follower pin 25 upon the surface 23 of cam 22. The contour of the surface 23 of cam 22 may thus impart a rocking motion to positioning gear 30 which is reflected to output shaft 32 as an advance or retard from a linear 1:1 rotational motion with respect to input shaft 10. It is thus seen that during *n* revolutions of input shaft 10 output shaft 32 goes through *n* revolutions but the motion of output shaft 32 is subject to the correction due to the position of positioning gear 30 as determined by the surface 23 of cam 22. Since as the input shaft 10 turns through its required number of turns (for example, 10), cam 22 turns through one turn less (or more), each point of cam 22 will be transferred by the follower pin 25 as a continual correcting influence on the motion of output shaft 32. Therefore, the contour of cam 22 can either advance or retard the position of output shaft 32 relative to input shaft 10 at any point throughout its travel.

As previously mentioned, the gear ratio between input gear 12 and cam drive gear 19 is chosen such that to realize correction through *n* turns of input shaft 10, the cam drive gear goes through $n\pm1$ turn. For example, should a 10-turn correction be desired, a ratio of 9:10 or 10:11 might be incorporated while for a 25-turn correction, a ratio of 24:25 or 25:26 might be incorporated. Further, it becomes apparent that, by changing the gear ratio between positioning gear 30 and output gear 31, the amount of correction of output shaft 32 for a given change in the radius of cam 22 may be altered to obtain the optimum value for a given application.

Figure 2:
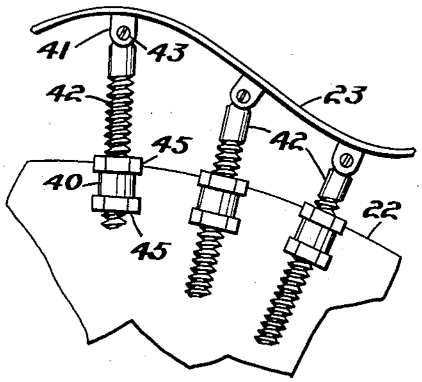
Figure 2 is a section of a type of adjustable cam which might be employed in conjunction with the embodiment of Figure 1.

Should the correcting mechanism of this invention be incorporated to impart a corrected rotation to a linear-tuned oscillator device such as previously mentioned, the cam 22 might be constructed as with an adjustable cam surface as illustrated in Figure 2. With reference to Figure 2, an alternate camming means is shown in a side view wherein the surface 23 is illustrated as being a flexible metallic ribbon. The position of various points along the surface 23 is illustrated as being adjustable by a plurality of arms 42 which might be received through a plurality of studs 40 affixed to a body member 22. Body member 22 would be rotatable in all respects similar to cam 22 in Figure 1. Arms 42 might then be slideably adjustable with respect to studs 40 and locked in place by means of nuts 45 on either side of studs 40. To realize the necessary articulation, arms 42 might be pivotally supported to end members 41, which members are rigidly affixed to the inner surface of cam surface 23. With such an arrangement, it is realized that the device of this invention might be incorporated as a corrector mechanism for a multiturn linear oscillator whereby all necessary fine correction of the oscillator shaft rotation throughout the number of turns involved for a complete tuning might be adjusted external of the oscillator per se by adjusting the cam surface 23 for the desired correction throughout its complete 360° correcting surface.

It becomes apparent from the description and drawings, therefore, that the device represents a simple and versatile approach to a multiturn correcting mechanism for any application wherein a given number of linear input revolutions are to be modified by the impartation of a slight retarding or advancing action from straight linear transfer of rotational motion. Since the cam employed is approximately circular in nature and the entire circumference of the cam is used for corrections, the required correction can, then, be realized in a smaller physical arrangement in that the cam in this invention might be approximately two inches in diameter to obtain the same effect as a six-inch linear correcting mechanism such as employed in the previously referenced Patent No. 2,468,071 to Theodore A. Hunter.

Although this invention has been described with respect to a particular embodiment thereof, it is not to be so limited as changes and modifications may be made therein which are within the full intended scope of the invention as defined by the appended claims.

I claim:

1. A motion-converting device comprising, an input shaft and an output shaft, camming means rotatably mounted coaxially with said input shaft, mechanical driving means disposed between said input shaft and said camming means to convert *n* revolutions of said input shaft to $n\pm m$ revolutions of said camming means, where *n* and *m* are unequal integers and *n* is greater than *m*, an output drive gear rotatably mounted coaxially with said input shaft, mechanical positioning means cooperating with said camming means and said output drive gear to drive said output drive gear and to advance or retard said drive in accordance with said camming means by a repetitive factor of *m* during *n* revolutions of said input shaft, and said output shaft mechanically connected to and positioned by said output drive gear.

2. A motion-converting device comprising, an input shaft and an output shaft, camming means mounted coaxially with and concentrically about said input shaft and rotatable with respect thereto, mechanical driving means disposed between said input shaft and said camming means to convert *n* revolutions of said input shaft to $n\pm m$ revolutions of said camming means, where *n* and *m* are unequal integers and *n* is greater than *m*, an output drive gear rotatably mounted coaxially with and concentrically about said input shaft, mechanical positioning means cooperating with said camming means and said output drive gear to drive said output drive gear and to advance or retard said drive in accordance with said camming means by a repetitive factor of *m* during *n* revolutions of said input shaft, and said output shaft rigidly affixed to and coaxial with said output drive gear.

3. A motion-converting device comprising, an input shaft and an output shaft, a first gear affixed to and rotatable with said input shaft, camming means rotatably mounted coaxially with said input shaft, a cam drive gear mounted to said camming means and coaxially rotatable therewith, gearing means connecting said first gear and said cam drive gear by a gear ratio of $n{:}n\pm m$, where *n* is a predetermined number of revolutions of said input shaft and *m* is an integer, an output drive gear mounted rotatably with respect to and coaxially with said input shaft, and mechanical positioning means cooperating with said cam and said output drive gear to position said drive gear, whereby *n* revolutions of said input shaft is reflected as *n* revolutions of said output shaft, said *n* output shaft revolutions being corrected by the influence of said entire cam surface of said camming means on said mechanical positioning means by a repetitive factor determined by the integer *m*.

4. A motion-converting device comprising, an input shaft and an output shaft, a first gear mounted upon and rotatable with said input shaft, camming means mounted coaxially with said input shaft and rotatably with respect thereto, a cam drive gear mounted coaxially to said camming means and rotatable therewith, gearing means connecting said first gear and said cam drive gear by a gear ratio of $n:n\pm m$, where $n$ is a predetermined number of revolutions of said input shaft and $m$ is an integer, an output drive gear rotatably mounted with respect to said input shaft and coaxial therewith, an arm member rigidly affixed to and rotated by said input shaft, mechanical positioning means mounted on said arm member and cooperating with said cam and said output drive gear to drive said output gear, and mechanical connecting means between said output shaft and said output drive gear, whereby $n$ revolutions of said input shaft is reflected as $n$ revolutions of said output shaft, said $n$ output shaft revolutions being corrected by the influence of said entire cam surface of said camming means on said mechanical positioning means by a repetitive factor determined by the integer $m$.

5. A motion-converting device comprising, an input shaft and an output shaft, a first gear affixed to and rotatable with said input shaft, camming means mounted coaxially with and concentrically about said input shaft and rotatably with respect thereto, a cam drive gear mounted to said camming means and rotatable concentrically about said input shaft, gearing means connecting said first gear and said cam drive gear by a gear ratio of $n:n\pm m$, where $n$ is a predetermined number of revolutions of said input shaft and $m$ is an integer, an output drive gear rotatably mounted with respect to and coaxially with said input shaft, an arm member rigidly affixed to and rotated by said input shaft, a positioning gear rotatably mounted on said arm member at a point radially displaced from the rotating axis thereof, said positioning gear meshing with said output drive gear, cam follower means connected to said positioning gear and cooperating with said cam to rotate said positioning gear with respect to said arm member, and said output shaft operably connected to said output drive gear and positioned thereby, whereby $n$ revolutions of said input shaft is reflected as $n$ revolutions of said output shaft, said $n$ output shaft revolutions being corrected by the influence of said entire cam surface of said camming means on said mechanical positioning means by a repetitive factor determined by the integer $m$.

6. A motion-converting device comprising, an input shaft and an output shaft, a first gear mounted concentrically with an rigidly on said input shaft, a radial cam mounted coaxially with and concentrically about said input shaft and rotatably supported thereby, a cam drive gear rigidly affixed to said cam and mounted coaxially with and concentrically about said input shaft and rotatably supported by said input shaft, gearing means operably connected between said first gear and said cam drive gear, an arm member rigidly affixed to and extending radially from said input shaft, an output drive gear mounted coaxially with an rotatably with respect to said input shaft, a positioning gear peripherally engaged with said output drive gear, said positioning gear rotatably mounted on said arm member, means for spring loading said positioning gear with respect to said cam, a pin member having one end rigidly affixed to said positioning gear at a point radially displaced from the rotational axis thereof, said pin member extending transversely from said positioning gear and having the other end in peripheral engagement with said cam, and mechanical connecting means between said output shaft and said output drive gear.

7. A motion-converting device comprising, an input shaft and an output shaft, a first gear mounted concentrically with an rigidly on said input shaft, a 360-degree radial cam mounted coaxially with and concentrically about said input shaft and rotatably supported thereby, a cam drive gear rigidly affixed to said cam and mounted coaxially with and concentrically about said input shaft and rotatably supported thereby, gearing means operably connected between said first gear and said cam drive gear such that a gear ratio of $n:n\pm m$ is formed between said input shaft and said cam, where $n$ is a predetermined number of revolutions of said input shaft and $m$ is an integer not equal to $n$, an arm member rigidly affixed to and extending radially from said input shaft, an output drive gear mounted coaxially with and rotatably supported by said input shaft, a positioning gear peripherally engaged with said output drive gear, said positioning gear rotatably mounted on said arm member, means for spring loading said positioning gear with respect to the surface of said cam, a pin member having one end rigidly affixed to said positioning gear at a point radially displaced from the rotational axis thereof, said pin member extending transversely from said positioning gear and having the other end in peripheral engagement with said cam, and mechanical connecting means between said output shaft and said output drive gear, whereby during $n$ revolutions of said input shaft said cam makes $m$ revolutions with respect to said pin member.

No references cited.